United States Patent [19]

Hayashi et al.

[11] Patent Number: 4,952,753
[45] Date of Patent: Aug. 28, 1990

[54] ELECTRIC CONNECTION BOX

[75] Inventors: Hideharu Hayashi; Takeshi Yanase, both of Kosai, Japan

[73] Assignee: Yazaki Corporation, Tokyo, Japan

[21] Appl. No.: 333,404

[22] Filed: Apr. 5, 1989

[51] Int. Cl.[5] ............................................. H05K 5/00
[52] U.S. Cl. ............................. 174/52.1; 220/DIG. 6; 361/399
[58] Field of Search ................... 174/52.1; 439/34, 76; 220/DIG. 6; 361/399, 407

[56] References Cited

U.S. PATENT DOCUMENTS 4,580,607  4/1986  Cantele ........................ 220/DIG. 6
4,871,884  10/1989  Hayashi ............................. 174/52.1

FOREIGN PATENT DOCUMENTS 2120853  12/1983  United Kingdom ................ 200/306

*Primary Examiner*—Leo P. Picard
*Assistant Examiner*—David A. Tone
*Attorney, Agent, or Firm*—Armstrong, Nikaido, Marmelstein, Kubovcik & Murray

[57] ABSTRACT

In an electric connection box containing a wiring board such as a bus bar circuit board and a surface cover set on the top of the wiring board and assembled inside the box body, the inside bottom surface of the box body is inclined to an angle that allows the downward flow of water droplets, spacers are projectingly installed upwardly on the inclined surface, and a spacing provided between the bus bar circuit formed in the lower surface of the wiring board in contact with the spacers and the inside bottom surface of the box body is greater than the height of the water droplets.

5 Claims, 4 Drawing Sheets

ELECTRIC CONNECTION BOX

BACKGROUND OF THE INVENTION

1. Field of the Invention

The present invention relates to an electric connection box for automotive electrical wiring and, more particularly, to an electric connection box of such a construction that water that has entered the connection box and dropped onto an inside bottom surface can easily be drained from the inside bottom surface to prevent its accumulation between a bus bar circuit of the bottom layer and the inside bottom surface of the box which is likely to cause current leakage to occur in the bus bar circuit of the bottom layer.

2. Description of the Prior Art and Problem

An electric connection box, such as a junction box and a relay box, generally has the constitution as shown in FIG. 5.

In this drawing, numeral 1 denotes a bus bar circuit board with bus bar circuits 2 arranged on both sides, and numeral 3 indicates a surface cover provided with a connector housing portion 4 which is apertured for connection of relays and others with the outside thereof.

Tab terminals 5 or 5A are installed on the bus bar circuit 2 of the bus bar circuit board 1, projecting out upwardly or downwardly of the bus bar circuit board 1.

The tab terminals 5 are inserted in the apertured connector housing portion 4 formed in the surface cover 3 set on the bus bar circuit board 1, or the tab terminals 5A are inserted in a connector housing portion 9 provided in the box body 6a. (See FIG. 6.)

The surface cover 3 and the bus bar circuit board 1 are housed inside the box body 6, and a waterproof cover 7 is installed at the top opening of the box body 6.

FIG. 6 shows the surface cover 3 and the bus bar circuit board 1 which are housed inside the box body 6, with bus bar circuits 2A and 2B arranged on the upper and lower surfaces of the bus bar circuit board 1.

In the connector housing 4 mounted on the surface cover 3 extend the tab terminals 5 which are mated with female terminals 8 are inserted.

Therefore, terminal housing chambers 4a of the connector housing 4 are in communication with the outside thereof through the connector housing portion 4 in the vertical direction. Through this apertured connector housing portion 4, water (or water vapour) can enter the inside via the terminal housing chamber 4a in the direction of the arrow C, and furthermore can drop into a hole 1a provided in the bus bar circuit board 1 through which the tab terminals 5 are disposed, gathering on the inside bottom 6a of the box body 6. Thus water droplets will be formed between the bus bar circuit 2B of the bottom layer and the inside bottom surface 6a.

Also in a spacing between both edges of the surface cover 3 and the inside wall surface, water (or water vapour) is likely to enter as indicated by the arrow D in FIG. 6. Most of the water flows down along the inside wall surface of the box body 6, being drained out at the drain port 6b provided at the corner area where the inside wall surface and the inside bottom surface 6a meet. A part of the water, however, enters a spacing between the bus bar circuit 2B and the inside bottom surface 6a, accumulating thereat.

Particularly in an engine compartment of automobiles, it is very likely that rain water will enter and that sweating will be caused by substantial changes in temperatures, resulting in the water entrance into the connection box as described above.

Also as shown in FIG. 7, the spacing S between the bus bar circuit 2B of the bottom layer and the inside bottom surface 6a is less than the height of water droplets G caused by the surface tension of the water droplets, and the water droplets G, therefore, will be confined between the bus bar circuit 2B and the inside buttom surface 6a, easily accumulating therein because of their frictional force. In this state, the water droplets G will become extremely difficult to drain.

SUMMARY OF THE INVENTION

The present invention has been accomplished in an attempt to solve the problem described above, and has as an object the provision of an electric connection box which is able to prevent the current leakage between the bus bar circuits of the bottom layer by easily draining water that has gathered on the inside bottom surface of the box body.

In accordance with the present invention wherein a wiring board, such as a bus bar circuit board, is housed and a surface cover is mounted over the wiring board and assembled in an electric connection box, the inside wall surface of the box body is inclined to an angle which allows water droplets to flow down, and projecting spacers are disposed on the inclined surface, thereby maintaining a wider spacing between the bus bar circuit provided on the lower surface of the wiring board in contact with the spacers and the inside bottom surface of the box body than the height of the water droplets.

Therefore, water droplets that have entered the electric connection box and dropped onto the inside bottom surface of the box body easily flow along the inclined surface which allows the flow of the water droplets, running down to the lowermost part of the box, and draining out at the drain port provided in the lowermost part, thereby almost solving the problem of water accumulation on the inside bottom surface of the box body.

Other features and advantages of the present invention will become apparent from the following description of the embodiment of the present invention, together with the accompanying drawings.

BRIEF DESCRIPTION OF THE DRAWINGS

FIG. 1 is a longitudinal sectional view of an electric connection box;

FIG. 2 is a longitudinal sectional view of a major portion thereof showing a relationship between spacers and water droplets;

FIGS. 3 and 4 are perspective views showing another embodiment of an electric connection box having an inclined surface;

DESCRIPTION OF THE PREFERRED EMBODIMENTS

Preferred embodiments of the present invention will now be described by referring to the accompanying drawings, in which the same reference numbers are used for the same parts as those appearing in the prior-art example.

Figure 1:
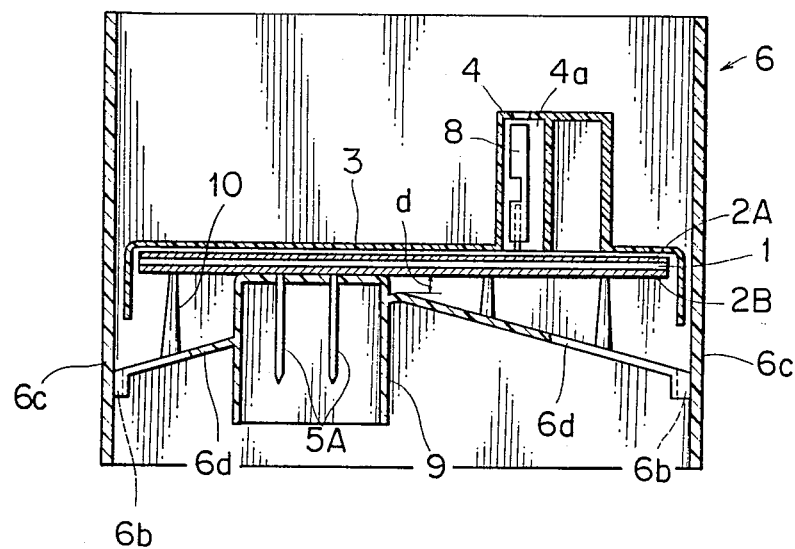
FIGS. 1 to 4 show an embodiment of the present invention.
Figure 2:
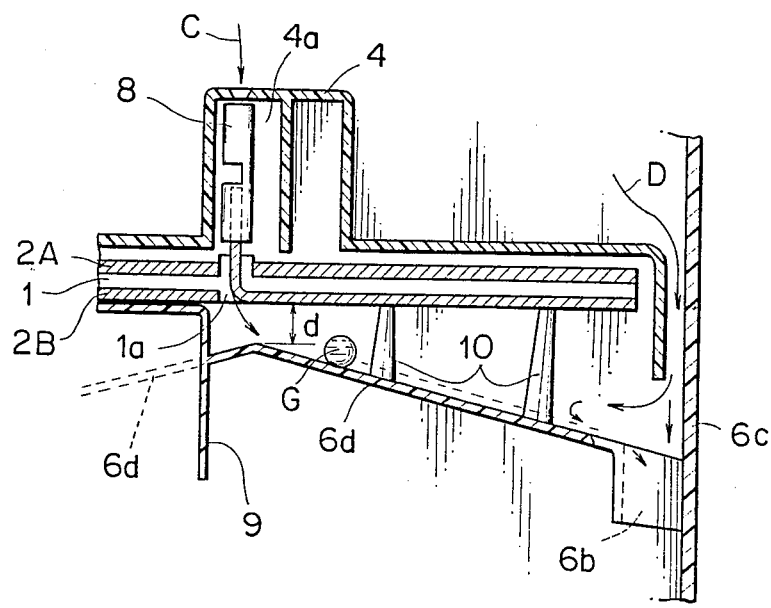

As shown in FIGS. 1 and 2, a bus bar circuit board 1 and a surface cover 3 are mounted on a connector housing 9 installed on the inside bottom surface of a box body 6. In the connector housing 9 are disposed tab terminals 5A projecting downwardly from a bus bar circuit 2A or 2B.

The inside bottom of the box body 6 has an inclined surface 6d which lowers as it goes toward a side wall 6c of the box body 6 from the central part. At the lower end of this inclined surface is provided a drain port 6b.

The angle of inclination of the inclined surface 6d is set to approximately 5° or more so that water droplets G on the inclined surface 6d will naturally flow down.

Figure 3:
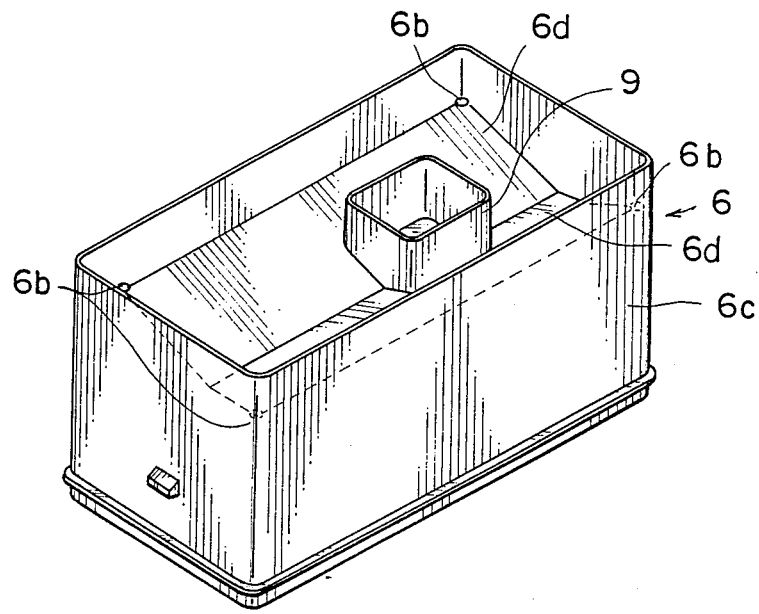
Figure 4:
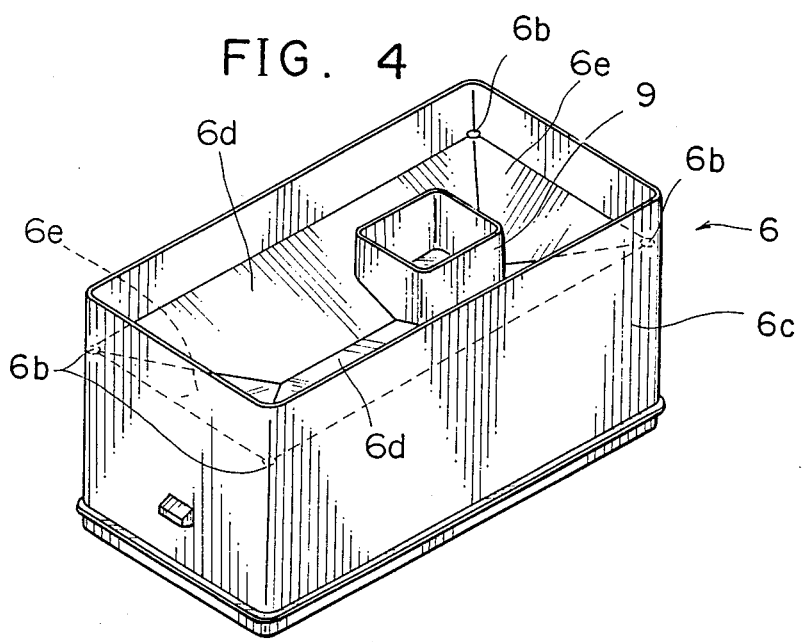
Figure 5:
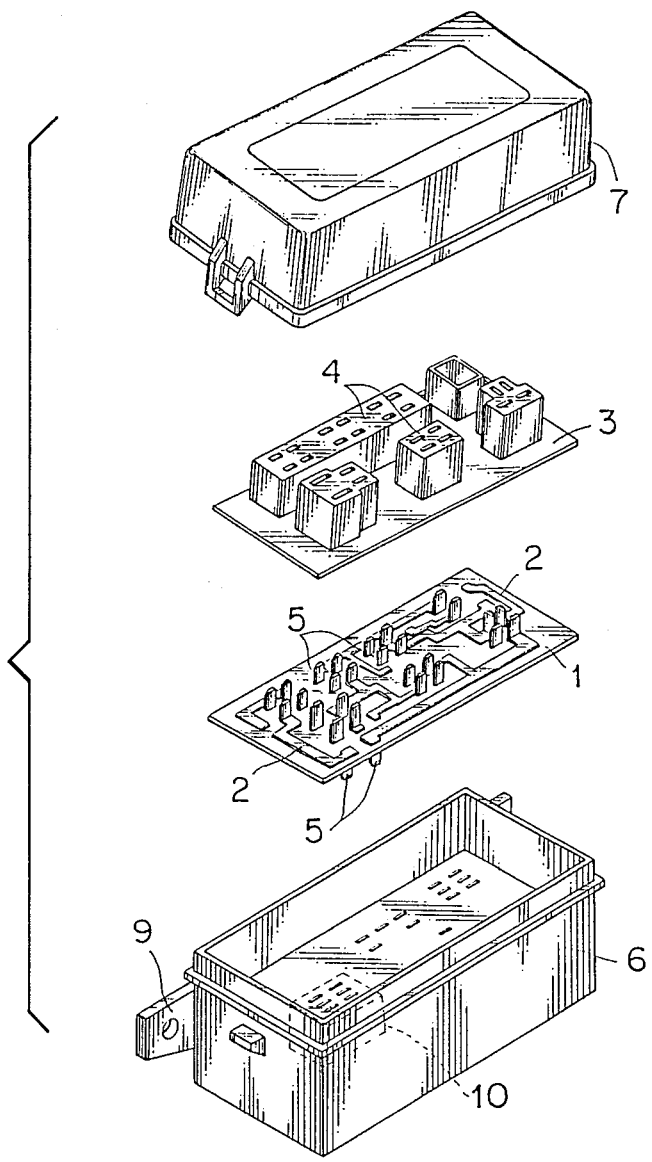
FIG. 5 is a perspective view of major component parts of the electric connection box.
Figure 6:
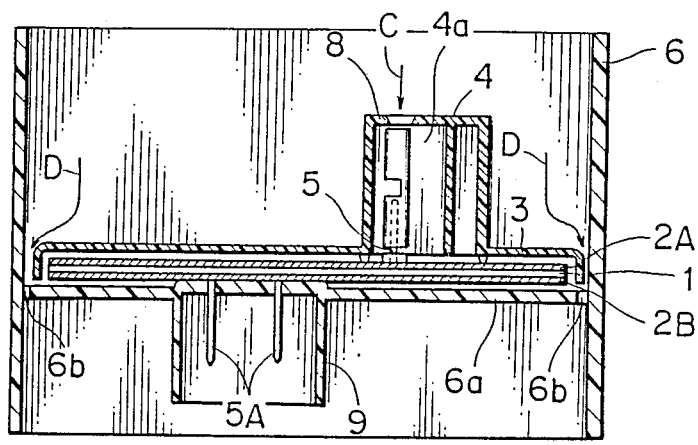
FIG. 6 is a longitudinal sectional view of an electric connection box of prior art.
Figure 7:
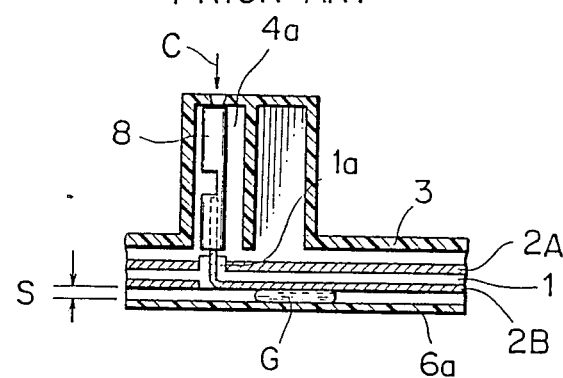
FIG. 7 is a longitudinal sectional view of a major portion thereof, showing the state of water droplets that have entered the connection box.

The embodiment of FIGS. 1 and 2 is further illustrated from the bottom side thereof as shown in FIG. 3. As described in the foregoing, the pair of inclined surfaces 6d meet at the center line portion of the entire floor space and slope down to lateral ends of the body. It is also advisable to provide a further pair of inclined surfaces 6e as shown in FIG. 4, which is also a bottom view, to extend down to the longitudinal ends of the box body.

In either form of inclined surfaces, there are provided nearly cylindrical spacers 10 whose top ends are at the same level as the upper surface of the connector housing 9, projectingly at a plurality of places of the inclined surface 6d as shown in FIGS. 1 and 2. In this case, the connector housing 9 also serves as a spacer.

Therefore, the bus bar circuit board 1 is mounted on the spacer 10. The spacing d between the bus bar circuit 2B formed on the lower surface of the bus bar circuit board 1 and the inclined surface 6d is set 6 mm or higher than the height (approx. 5 mm) of water droplets G formed globular by the surface tension.

The construction of other parts of the electric connection box is the same as conventional ones.

Water that has entered a terminal housing 4a of the electric connection box in the direction of the arrow C falls to the inclined surface 6d through a tab terminal insertion hole 1a provided in the bus bar circuit board 1, and flows down the inclined surface 6d, going out at the drain port 6b.

Also, as indicated by the arrow D, water entering between the edge of the surface cover 3 and the side wall 6c similarly goes out at the drain port 6b.

Furthermore, because the minimum spacing d between the inclined surface 6d and the bus bar circuit 2B is larger than the maximum height of the wide droplets G, there is no fear that water droplets will gather in the bus bar circuit 2B to cause current leakage.

The minimum spacing d stated above, which is maintained by the spacers 10 and the connection housing 9, may be maintained by a plurality of connector housings.

According to the present invention, the inside bottom wall of the electric connection box body is so inclined as to allow the downward flow of water droplets; thus water that falls on to the inside bottom wall will go out without gathering therein. In addition, because the spacing between the bus bar circuit of the bottom layer and the inclined surface is greater than the height of water droplets, there is no fear that water will come in contact with the bus bar circuit of the bottom layer to cause current leakage.

While preferred embodiments have been described, variations thereto will occur to those skilled in the art within the scope of the present inventive concepts which are described by the following claims.

What is claimed is:

1. An electric connection box structure comprising
   a box body having a floor means therein;
   a wiring circuit board set on said floor means;
   a surface cover set on top of said wiring circuit board; and
   spacer means provided between said wiring circuit board and said floor means to define a space therebetween larger than water droplets; and
   said floor means being inclined such that said water droplets flow down said inclined floor means.

2. An electric connection structure according to claim 1, wherein said floor means includes a pair of surfaces meeting each other at a center portion thereof and sloping down to lateral ends of said box body.

3. An electric connection structure according to claim 1, said floor means further includes another pair of surfaces each sloping down to longitudinal ends of said box body.

4. An electric connection structure according to claim 2, wherein said pair of inclined surfaces have drain ports in said lateral ends.

5. An electric connection structure according to claim 3, wherein said further pair of inclined surfaces have drain ports in said longitudinal ends.

* * * * *